(12) United States Patent
Hill et al.

(10) Patent No.: US 6,458,431 B2
(45) Date of Patent: Oct. 1, 2002

(54) METHODS FOR THE LITHOGRAPHIC DEPOSITION OF MATERIALS CONTAINING NANOPARTICLES

(75) Inventors: Ross H. Hill, Coquitlam; Juan Pablo Bravo-Vasquez, Burnaby, both of (CA)

(73) Assignee: EKC Technology, Inc., Hayward, CA (US)

(*) Notice: Subject to any disclaimer, the term of this patent is extended or adjusted under 35 U.S.C. 154(b) by 0 days.

(21) Appl. No.: 09/918,908

(22) Filed: Jul. 30, 2001

Related U.S. Application Data

(60) Provisional application No. 60/221,844, filed on Jul. 28, 2000.

(51) Int. Cl.$^7$ ................................................. H05H 1/00
(52) U.S. Cl. ........................ 427/537; 427/256; 427/331; 427/383.1; 427/427; 427/430.1; 427/533; 427/576; 427/581; 427/595; 427/597
(58) Field of Search ................................ 427/533, 537, 427/576, 581, 595, 597, 256, 331, 383.1, 427, 430.1

(56) References Cited

U.S. PATENT DOCUMENTS 5,534,312 A   7/1996  Hill et al. .................... 427/533
5,851,507 A  12/1998  Pirzada et al. ............... 423/659
5,952,040 A   9/1999  Yadav et al. ............... 427/126.3
5,984,997 A  11/1999  Bickmore et al. ............ 75/343

OTHER PUBLICATIONS

M. Chaya et al., "Quantum Confinement: Nanoscale Materials, Devices and Systems." Electrochem.

Soc. Proceedings, Vol.97–11, pp.35–46 (1997).

Y. Yonezawa, Y. Konishi, H. Hada, K. Yamamoto and H. Ishida, "Formation of silver metal films by photolysis of silver salts of high molecular weight carboxylic acids, "Thin Solid Films, 218 (1992) 109–121.

Primary Examiner—Bernard Pianalto
(74) Attorney, Agent, or Firm—Pennie & Edmonds LLP

(57) ABSTRACT

A method for depositing nanoparticles in a thin film through the dispersion of such nanoparticles in a precursor solution which is deposited on a substrate and converted into a metal or metal oxide film. The resulting metal or metal oxide film will contain embedded nanoparticles. Such films can be used in a variety of applications such as diffusion barriers, electrodes for capacitors, conductors, resistors, inductors, dielectrics, or magnetic materials. The nanoparticle material may be selected by one skilled in the art based on the particular application.

24 Claims, 1 Drawing Sheet

METHODS FOR THE LITHOGRAPHIC DEPOSITION OF MATERIALS CONTAINING NANOPARTICLES

This application claims priority to Provisional Patent application Ser. No. 60/221,844, filed Jul. 28, 2000, entitled "METHODS FOR THE LITHOGRAPHIC DEPOSITION OF MATERIALS CONTAINING NANOPARTICLES."

FIELD OF THE INVENTION

This invention is related to methods of depositing films of metals or metal oxides with embedded nanoparticles, from metal complexes or precursor solutions. The invention also relates to the use of such films in a variety of applications including but not limited to microelectronics fabrication.

DESCRIPTION OF RELATED ART

Usually films of inorganic materials are deposited by chemical or physical vapor deposition although in some cases Sol gel or metal organic deposition have been used.

None of these methods, however, are able to pattern films of materials and, therefore, must be used with other methods to form the patterned structures normally used in the construction of microelectronic devices or circuits.

The photochemical deposition method differs from the above two methods in that the reaction which drives off the organic components is photochemically activated. Hybrid methods often use light as the energy source, but the light used initiates a thermal rather than a photochemical reaction.

U.S. Pat. No. 5,534,312 to Hill et al. discloses a method for the deposition of a variety of metal and metal oxide systems using photochemical deposition. This process relies upon the construction of an optical quality film of the precursor material in order to provide (macroscopic) optical homogeneity during the lithographic process.

The formation of nanoscale particles of different materials is known in the art. For example, U.S. Pat. No. 5,984,997 to Bickmore et al., incorporated herein, discloses a process for producing nanoscale powders by mixing an emulsion comprising all of the elements of the desired powder composition and a combustible fuel, and then combusting that emulsion to produce a powder. The '997 patent process discloses the production of many types of powders, including particles and nanowhiskers of simple, doped, and polymetallic powders.

Forming a material with imbedded nanoparticles through use of a precursor material is disclosed in U.S. Pat. No. 5,851,507 to Pirzada et al., incorporated herein, where a continuous process is used to produce nanoscale powders from different types of precursor materials by evaporating the material and quenching the vaporized phase in a converging-diverging expansion nozzle. However, the '507 patent does not disclose a photochemical technique of converting the precursor material to a metal or metal oxide film with imbedded nanoparticles. Also, M. Cahay, et al., Quantum Confinement: Nanoscale Materials, Devices, and Systems, Electrochemical Soc. Proceedings Volume 97–11, pp. 35–46 1997, incorporated herein, describe embedding nanoparticles in a thermal sol gel matrix but also does not disclose converting or patterning a thin film deposited from a precursor material.

The use of nanoparticles or nanoscale particles in passive components has previously been found to be beneficial. For example, U.S. Pat. No. 5,952,040 to Yadav et al., incorporated herein, discloses nanosize powders which are used to form the ceramic layers of passive electronic components. The ceramic layers containing nanoscale powders are deposited between electrodes to form an electrode/ceramic/electrode structure. The ceramic layer is dried at low temperatures to prevent interdiffusion problems of the nanoscale powders. However, the '040 patent does not disclose a means to distribute the nanoscale powders directly within a metal or metal oxide film, nor does the '040 patent teach a photochemical technique of converting the precursor material to a metal or metal oxide film.

The present invention is an extension of these technologies and discloses a means to embed nanoparticles in metal or metal oxide films for various lithographic applications.

SUMMARY OF THE INVENTION

The present invention discloses a method for depositing nanoparticles in a thin film. The nanoparticles are dispersed in a precursor solution which is deposited on a substrate and converted into a metal or metal oxide film. The precursor film may be deposited on the surface by a variety of methods. The conversion to metal or metal oxide film can be achieved by photochemical reaction or by the impact of an ion or an electron beam. The resulting metal or metal oxide film thereby contains embedded nanoparticles. By use of a mask or a directed beam, the metal or metal oxide film can be patterned. By altering the atmosphere in which the pattern is formed, the composition and/or properties of the resulting metal or metal oxide film can be altered.

Such films can be used in a variety of applications such as diffusion barriers, electrodes for capacitors, conductors, resistors, inductors, dielectrics, or magnetic materials. The resulting film may be amorphous or crystalline based on the application. The nanoparticle material may be selected by one skilled in the art based on the particular application.

BRIEF DESCRIPTION OF THE FIGURES

The FIGURE shows a latent image of CdS particles in manganese (II) 2-ethylhexanoate Film

DETAILED DESCRIPTION

Figure 1:
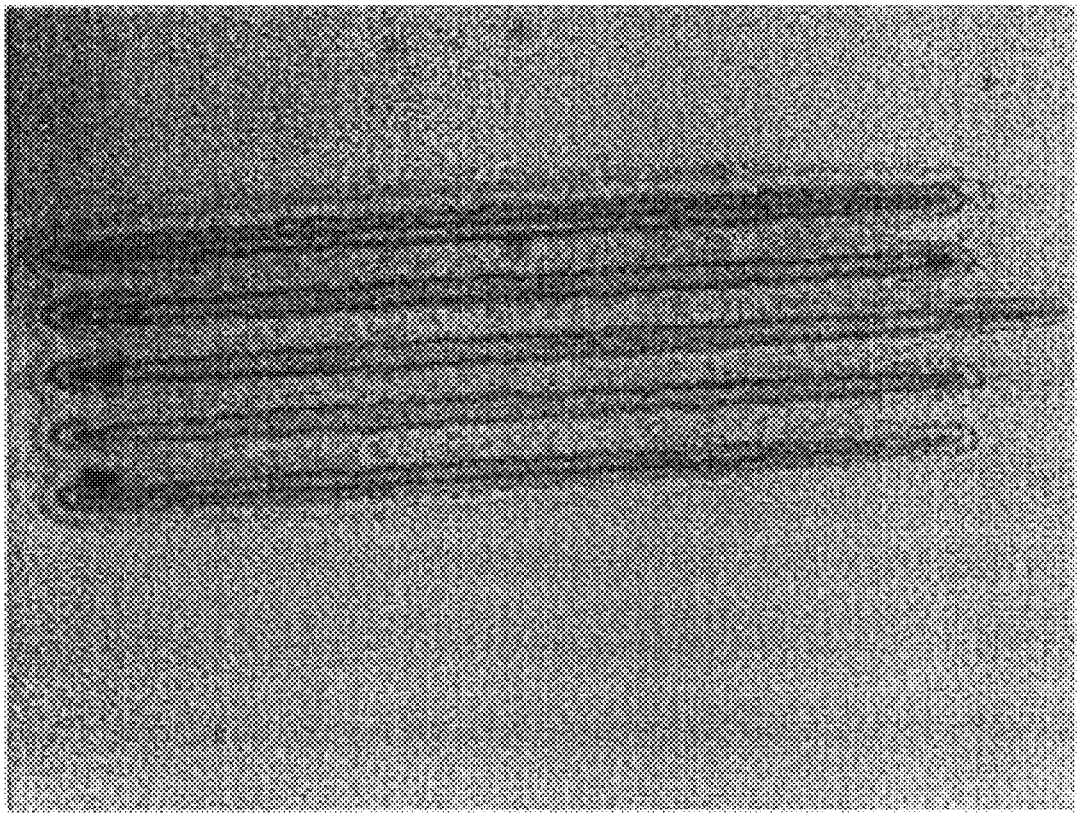

The present invention discloses a process of combining the precursor solution with nanoparticles which are then deposited on a substrate and patterned, for example, photochemically.

One of the purposes for embedding nanoparticles is to gain a localized difference in the particular material. Nanoparticles embedded in materials can have many practical applications, including but not limited to, use as diffusion barriers, electrodes for capacitors, conductors, resistors, inductors, dielectrics, and magnetic materials, generally. Another application of these materials is to prepare optical filters which make use of the optical properties of the nanoparticles. Similar applications could make use of electrochromatic nanomaterials in a suitable matrix for optical display applications. Additionally, the use of nanomaterials which are electro (or photo) luminescent in a matrix would also provide low temperature routes to the assembly and patterning of these materials.

The types of materials of which the nanoparticles are made are tied to the application. For example, magnetic materials composed of single domain particles could be patterned in this process and used in memory applications. Such nanoparticles would typically be rare earth magnets. The source of nanoparticles or the material may be judiciously selected by a person of ordinary skill in the art pertaining to the particular application.

Passive components, such as ferroelectrics, could be used as well. These could be patterned for use in memory and capacitors, for example.

The present invention uses metal complexes with nanoparticles to form liquid crystal films, which can be converted to metal or metal oxide films by a variety of methods, including, but not limited to the methods described in U.S. Pat. No. 5,534,312 to Hill et al., which is incorporated herein by reference.

Typical films may be deposited on various substrates. These include materials as wide ranging as simple salts, such as $CaF_2$, to semiconductor surfaces such as silicon. The nature of the substrate is not critical for the process although it may effect the method of deposition of the precursor film (and, if used, the solvent for the deposition). The most commonly used substrate has been silicon wafers. These wafers may have been coated with other layers such as dielectric layers, photoresist or polyimide, metal oxides, thermal oxides, conduction materials, insulating materials, ferroelectric materials or other materials used in the construction of electronic devices. These include silicon single crystal wafers.

The precursor film may be deposited on the surface by a variety of methods, one of which is spin coating the molecule from a solvent. In this procedure, a precursor and nanoparticles are dispersed in a solvent to form a precursor solution. The substrate surface is then put on a surface, which can be spun. The substrate may be held in place with a vacuum chuck such as present in a commercial spin coater (i.e. from Headway or Laurell Corporation). The precursor solution is dispensed onto the surface of the substrate either before commencing spinning or while the substrate is spinning. The substrate is then allowed to spin resulting in the deposition of a thin film of the precursor on the surface.

The films may also be formed by other methods including but not limited to spray on, dip coating and various inking methods.

In one embodiment this film undergoes a photochemical reaction resulting in the conversion of the metal complex into a metal or metal oxide material in which the nanoparticles are trapped. Since this process can be performed at low temperature (ambient or below) it is possible to limit the interdiffusion of the matrix material with the nanoparticles. By performing the reaction at higher temperature, it is possible to interdiffuse the two materials and lose the nanostructuring. By controlling the temperature of the process it is possible to achieve intermediate situations as well. This is an advantage of this system since, by the photochemical conversion, it is possible to control the reaction which forms the matrix independent of the thermal interdiffusion.

Typically the film may be exposed to light directed though an optical mask used to define an image on the surface. The mask consists of transparent and light absorbing regions. The mask may also include an optical enhancing feature such as phase shift technology. Exposure of the film with this light results in a chemical reaction within the film which changes the film from precursor to the product. This type of conversion is consistent with that described in U.S. Pat. No. 5,534,312.

The light does not necessarily have to be directed through a mask. For example, if it is not necessary to pattern the material, a flood exposure may be used. Alternatively, if patterning is desired, a direct writing approach may be used. In a common implementation of the direct writing process laser beam is directed in a serial fashion over the surface resulting in exposure only of the areas where the beam was directed. Alternatively, near field optical systems allow selective exposure of some areas of the surface. In another alternative embodiment of the invention, the film may be converted in multiple steps or stages where a portion of the film is converted at a time. By using this approach, for example, the resulting film may comprise different materials in a pattern by sequentially converting portions of the film in selective atmospheres.

Normally the atmosphere used for the exposure is air. It may, for a variety of reasons, be preferable to change the composition of the atmosphere present during exposure. One reason is to increase the transmission of the exposing light because short wavelength light is used which may be attenuated by air. It may also be desirable to change the composition of the atmosphere to alter the composition or properties of the product film.

Exposure may also be achieved with ion or electron beams. These are normally directed in a serial write process. The ion or electron beam is directed onto the precursor film, which causes a reaction to produce the product film in the exposed areas. The nature of the exposure systems for ion and electron beams are such that these are normally done within a vacuum. The deposit from such a process may be, depending upon the conditions, the metal which oxidizes to form oxide upon exposure to air.

EXAMPLE 1

Nanometer scale CdS dots were prepared by the reverse micelle method following the general procedure outlined by Steigerwald et. al. In a typical experiment, equal volumes of microemulsions prepared under nitrogen from of $CdClO_4$ (0.72 mL as a 0.4 M aqueous solution) and sodium bis (2-ethylhexyl)sulfosuccinate (AOT) (0.2 M) in heptane (50 ml) and $Na_2S$ (0.72 mL as a 0.3 M aqueous solution) and (AOT) (0.2 M) in heptane (50 ml) were combined in a flask and stirred under nitrogen for 2 hours. The solvent was then removed under reduced pressure and the product resuspended in petroleum ether. A separate petroleum ether solution of Mn(II) 2-ethylhexanoate was prepared and the two solutions were combined.

The resultant solution was spin coated onto a silicon wafer and exposed to 254 nm light resulting in the conversion of Mn(II) 2-ethylhexanoate to manganese oxide. The nanoparticles were dispersed within the manganese oxide material.

By irradiation through a mask, a patterned film could be formed in this process. The FIGURE shows the latent image formed from the CdS particles in a manganese(II) 2-ethylbexanoate film.

EXAMPLE 2

In a similar experiment to Example 1, micron scale CdS particles were prepared by a modification of the method of Dona and Herrero. A solution of thiourea (10 mmol), cadmium acetate (10 mmol), and ethylene glycol (0.4 mL) in a 150 mL aqueous ammonium chloride/ammonia buffer (pH 10) was prepared. A glass substrate was inserted into the solution and this solution was heated to 80° C. overnight. The solution was allowed to cool and the adherent CdS particles were collected on the glass substrate which was removed from the solution. These particles were suspended in petroleum ether and combined with a Mn(II) 2-ethylhexanoate in petroleum ether solution. This solution was spin coated onto a silicon surface and photolysis resulted in the formation of nanoparticles embedded on the surface of the thin manganese oxide film.

Those skilled in the art will appreciate that variations to the above-described methodology may occur without departing from the scope of the invention. Thus, it follows that the invention is not limited to the particular examples or details described above.

What is claimed is:

1. A method of depositing films comprising one or more metals or metal oxides with embedded nanoparticles;

wherein the nanoparticles are in a metal-ligand precursor solution which is deposited on a substrate and photochemically converted.

2. The method of claim 1 wherein the film is patterned.

3. A method of depositing films comprising one or more metals or metal oxides with embedded nanoparticles, said method comprising:

Dispensing nanoparticles in a precursor solution of metal complexes;

Depositing the precursor solution onto a substrate; and

Converting the precursor solution deposited on the substrate to a metal or metal oxide film with embedded nanoparticles.

4. The method of claim 3 wherein the depositing is done by spin coating.

5. The method of claim 3 wherein the depositing is done by spraying.

6. The method of claim 3 wherein the depositing is done by dip coating.

7. The method of claim 3 wherein the depositing is done by inking.

8. The method of claim 3 wherein the conversion is done electromagnetically.

9. The method of claim 3 wherein the conversion is done photochemically.

10. The method of claim 3 wherein the conversion is done thermally.

11. The method of claim 3 wherein the conversion is done with a plasma.

12. The method of claim 3 wherein the conversion is done with an ion beam.

13. The method of claim 3 wherein the conversion is done with an electron beam.

14. The method of claim 3 wherein the metal or metal oxide film formed by the conversion step is patterned.

15. The method of claim 14 wherein the film is sequentially converted in two or more steps.

16. The method of claim 14 wherein the conversion is done electromagnetically.

17. The method of claim 14 wherein the conversion step is done photochemically.

18. The method of claim 14 wherein the conversion is done thermally.

19. The method of claim 14 wherein the conversion is done with a plasma.

20. The method of claim 14 wherein the conversion is done with an ion beam.

21. The method of claim 14 wherein the conversion is done with an electron beam.

22. The method of claim 3 wherein interdiffusion of the nanoparticles with the metal or metal oxide can b e controlled by varying t he temperature at which the conversion occurs.

23. The method of claim 3 wherein the composition or properties of the film is altered due to the composition of the atmosphere in which the conversion takes place.

24. A method of forming patterned films comprising one ore more metals or metal oxides with embedded nanoparticles, said method comprising:

Dispensing nanoparticles in a precursor solution comprising metal complexes;

Depositing the precursor solution onto a substrate; and

Photochemically converting the precursor solution deposited on the substrate to a patterned metal or metal oxide film with embedded nanoparticles.

* * * * *